United States Patent
Liao et al.

(10) Patent No.: US 10,877,382 B2
(45) Date of Patent: Dec. 29, 2020

(54) METHOD FOR HANDLING MASK AND LITHOGRAPHY APPARATUS

(71) Applicant: TAIWAN SEMICONDUCTOR MANUFACTURING CO., LTD., Hsinchu (TW)

(72) Inventors: Ju-Wei Liao, Taichung (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/216,859

(22) Filed: Dec. 11, 2018

(65) Prior Publication Data

US 2020/0057385 A1  Feb. 20, 2020

Related U.S. Application Data

(60) Provisional application No. 62/718,962, filed on Aug. 14, 2018.

(51) Int. Cl.
| | | |
|---|---|---|
| *H01L 21/00* | (2006.01) | |
| *G03F 7/20* | (2006.01) | |
| *H01L 21/027* | (2006.01) | |
| *H01L 21/66* | (2006.01) | |

(52) U.S. Cl.
CPC ...... *G03F 7/70608* (2013.01); *G03F 7/70583* (2013.01); *G03F 7/70633* (2013.01); *G03F 7/70925* (2013.01); *H01L 21/027* (2013.01); *H01L 22/12* (2013.01)

(58) Field of Classification Search
CPC ... H01L 22/12; H01L 21/027; G03F 7/70608; G03F 7/70583; G03F 7/70633; G03F 7/70925

See application file for complete search history.

(56) References Cited

U.S. PATENT DOCUMENTS

| | | | | |
|---|---|---|---|---|
| 6,521,889 | B1* | 2/2003 | Ina | G01N 21/88 356/237.3 |
| 2005/0219518 | A1* | 10/2005 | Korngut | G01N 21/4788 356/237.2 |
| 2011/0188011 | A1 | 8/2011 | Ehm et al. | |
| 2014/0322654 | A1 | 10/2014 | Sentoku et al. | |
| 2015/0090295 | A1* | 4/2015 | Ng | H01L 21/67051 134/18 |

(Continued)

FOREIGN PATENT DOCUMENTS

| | | |
|---|---|---|
| CN | 203838473 U | 9/2014 |
| CN | 105487339 A | 4/2016 |
| JP | 2016-165687 A | 9/2016 |

(Continued)

*Primary Examiner* — Richard A Booth
(74) *Attorney, Agent, or Firm* — Maschoff Brennan

(57) ABSTRACT

A method for handling a mask is provided in accordance with some embodiments of the present disclosure. The method includes determining whether a particle is present on a contact surface of a mask. The mask is cleaned to remove the particle from the contact surface of the mask if the particle is present on the contact surface. The mask is disposed on a chuck after cleaning the mask, wherein the contact surface of the mask contacts the chuck when the mask is disposed on the chuck. A lithography process is performed using the mask disposed on the chuck.

20 Claims, 7 Drawing Sheets

(56) References Cited

U.S. PATENT DOCUMENTS

2015/0165476 A1* 6/2015 Kim .................... B81C 1/0038
428/172
2015/0323875 A1 11/2015 De Graaf et al.

FOREIGN PATENT DOCUMENTS

| TW | I429899 B | 3/2014 |
| TW | 201708979 A | 3/2017 |
| TW | I575339 B | 3/2017 |

\* cited by examiner

METHOD FOR HANDLING MASK AND LITHOGRAPHY APPARATUS

PRIORITY CLAIM AND CROSS-REFERENCE

This application claims priority to U.S. Provisional Application Ser. No. 62/718,962, filed Aug. 14, 2018, which is herein incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a photolithography process is limited by the wavelength of the projected radiation source. photolithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
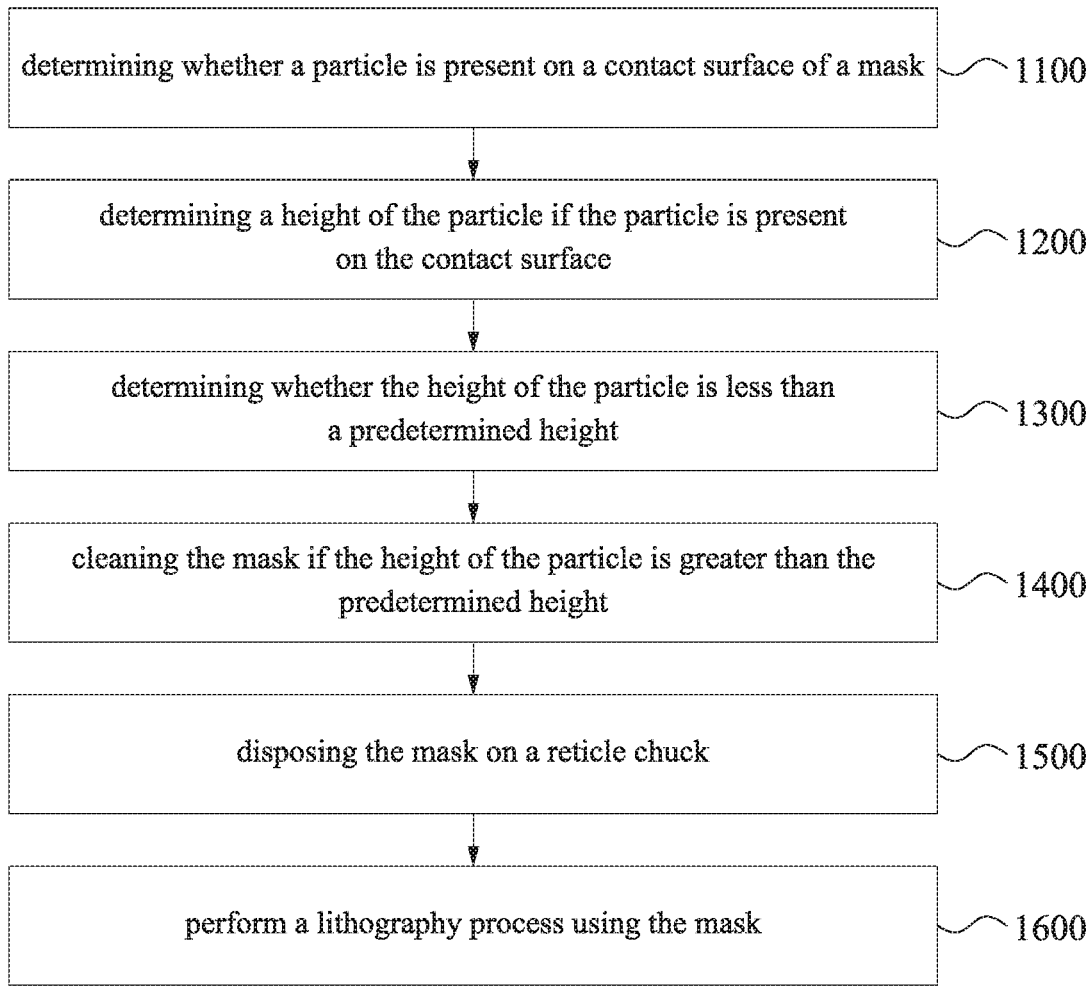
FIG. 1 is a flow chart illustrating a method for handling a mask in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon wafers are manufactured in a sequence of successive steps including mask alignment, exposure, photoresist development, layer etch, and epitaxial layer growth to form a pattern which defines device structures and interconnects within an integrated circuit (IC). To guarantee robust mask alignment, dedicated alignment structures are placed within physical layout data of the IC, and are utilized by an in-line alignment tool within a semiconductor manufacturing flow to achieve overlay (OVL) control during mask alignment. A patterned wafer includes a plurality of ICs arranged into a periodic array or mask fields, in which each mask field is patterned by a step-and-repeat tool configured to align a patterned mask to an individual mask field based upon a wafer map of alignment structure locations obtained from the physical layout data of the IC. Yield and device performance rely upon robust OVL control between two or more mask alignment steps when forming layers of a device.

Accordingly, some embodiments of the present disclosure relate to a method to achieve enhanced overlay control. Before a mask is held by a chuck, a contact surface of the mask that is to be in contact with the chuck is inspected to determine whether a particle is present on the contact surface of the mask. If the particle is present on the contact surface of the mask, the mask is cleaned to remove the particle from the contact surface of the mask. After the particle is removed from the contact surface of the mask, the mask is disposed on the chuck, in which the contact surface of the mask is in contact with the chuck. Since the particle is removed from the contact surface of the mask, the mask would not have a significant deformation when the contact surface of the mask is in contact with the chuck, and hence the overlay control is enhanced.

Reference is made to FIG. 1, a flow chart illustrating a method 1000 for handling a mask in accordance with some embodiments of the instant disclosure. The method 1000 begins with operation 1100 in which whether a particle is present on a contact surface of a mask is determined. The method 1000 continues with operation 1200 in which a height of the particle is determined, if the particle is present on the contact surface. The method 1000 continues with operation 1300 in which whether the height of the particle is less than a predetermined height is determined. The method 1000 continues with operation 1400 in which the mask is cleaned if the height of the particle is greater than the predetermined height. The method 1000 continues with operation 1500 in which the mask is disposed on a chuck. The method 1000 continues with operation 1600 in which a lithography process is performed using the mask.

Figure 2:
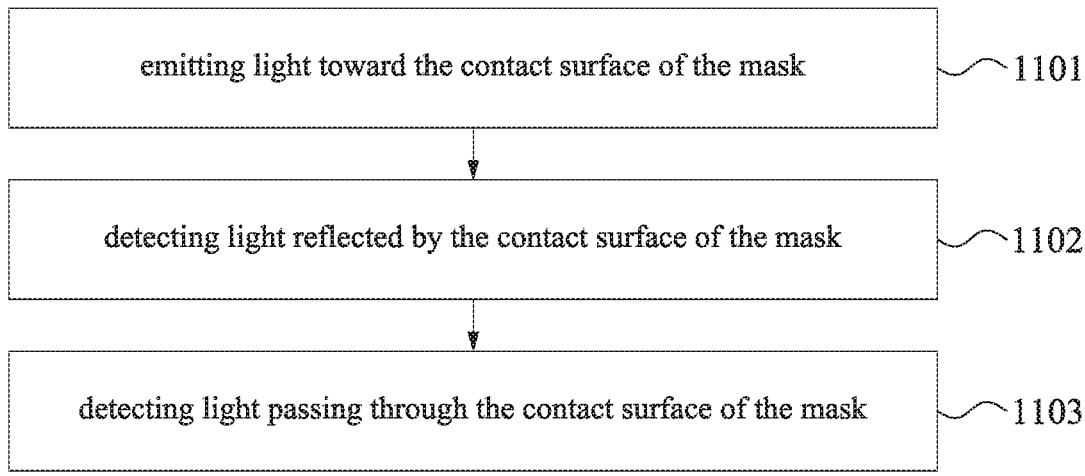
FIG. 2 is a flow chart illustrating sub-operations of an operation of the method for handling the mask in accordance with some embodiments of the instant disclosure.

Reference is made to FIG. 2, a flow chart illustrating sub-operations of the operation 1100 of the method 1000 for handling the mask in accordance with some embodiments of the instant disclosure. The operation 1100 begins with sub-operation 1101 in which light is emitted toward the contact surface of the mask. The operation 1100 continues with sub-operation 1102 in which light reflected by the contact surface of the mask is detected. The operation 1100 continues with sub-operation 1103 in which light passing through the contact surface of the mask is detected. In some embodiments, the sub-operation 1103 may be omitted if the mask is made of an opaque material.

Figure 3:
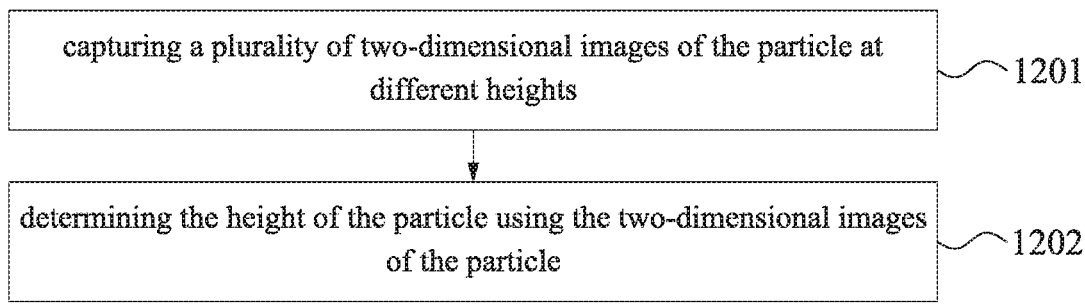
FIG. 3 is a flow chart illustrating sub-operations of an operation of the method for handling the mask in accordance with some embodiments of the instant disclosure.

Reference is made to FIG. 3, a flow chart illustrating sub-operations of the operation 1200 of the method 1000 for handling the mask in accordance with some embodiments of the instant disclosure. The operation 1200 begins with sub-operation 1201 in which a plurality of two-dimensional images of the particle at different heights are captured. The operation 1200 continues with sub-operation 1202 in which the height of the particle is determined using the two-dimensional images of the particle.

The discussion that follows illustrates embodiments of a lithography apparatus that can be operated according to the method 1000 of FIGS. 1-3. While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 4:
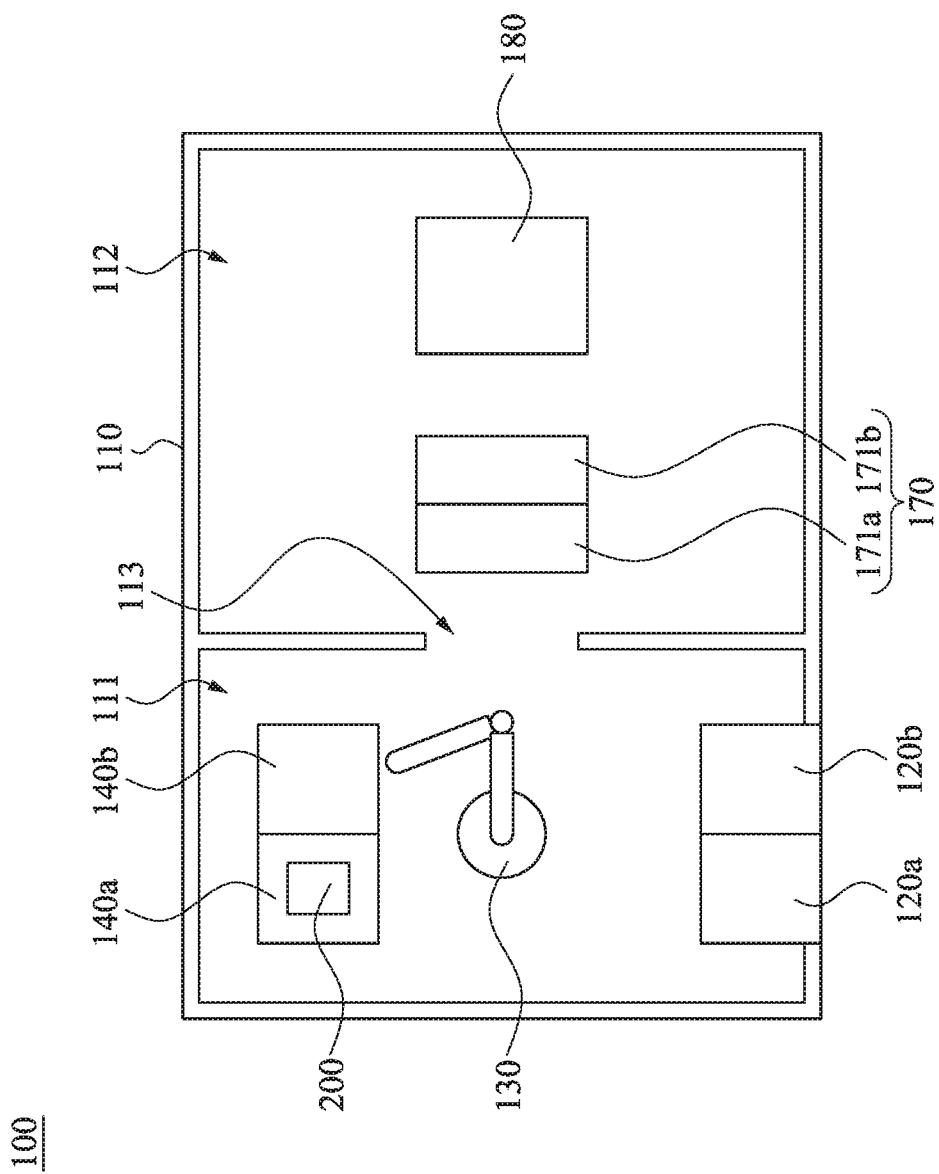
FIG. 4 is a schematic diagram illustrating a lithography apparatus in accordance with some embodiments of the instant disclosure.

Reference is made to FIG. 4. FIG. 4 is a schematic diagram illustrating a lithography apparatus 100 in accordance with some embodiments of the instant disclosure. The lithography apparatus 100 includes a housing 110, two load ports 120a, 120b, a robot arm 130, a first holder 140a, and a second holder 140b. The housing 110 has a first compartment 111. The two load ports 120a, 120b are arranged at a first side of the first compartment 111 and are in communication with the first compartment 111. Each of the two load ports 120a, 120b is configured to load a mask 200 into the first compartment 111 and is configured to unload the mask 200 from the first compartment 111. The robot arm 130, the first holder 140a, and the second holder 140b are located in the first compartment 111. The robot arm 130 is configured to transfer the mask 200 at least among the two load ports 120a, 120b, the first holder 140a, and the second holder 140b. For example, the robot arm 130 is configured to transfer the mask 200 from one of the two load ports 120a, 120b to the first holder 140a, is configured to transfer the mask 200 from the first holder 140a to the second holder 140b, and is configured to transfer the mask 200 from the second holder 140b to one of the two load ports 120a, 120b to unload the mask 200. The first holder 140a is configured to hold the mask 200 at a first place in the first compartment 111. The second holder 140b is configured to hold the mask 200 at a second place in the first compartment 111. In some embodiments, the first holder 140a and the second holder 140b are near a second side of the first compartment 111 opposite to the first side of the first compartment 111 at which the two load ports 120a, 120b are, and the robot arm 130 is between the two load ports 120a, 120b and the first and second holders 140a, 140b.

As shown in FIG. 4, the housing 110 further has a second compartment 112. The second compartment 112 and the first compartment 111 share a sidewall. The sidewall has a passage 113 therein. The first compartment 111 and the second compartment 112 communicate by the passage 113. The lithography apparatus 100 further includes a turret 170 and a chuck 180. The turret 170 and the chuck 180 are located in the second compartment 112. The turret 170 is between the passage 113 and the chuck 180. The robot arm 130 is further configured to transfer the mask 200 from the first compartment 111 to the turret 170 and is configured to transfer mask 200 from the turret 170 to the first compartment 111 through the passage 113. The turret 170 is configured to transfer the mask 200 to the chuck 180 and is configured to remove the mask 200 from the chuck 180. A combination of the robot arm 130 and the turret 170 may be regarded as a transferring mechanism configured to transfer the mask 200 among the chuck 180, the first holder 140a, and the second holder 140b.

In some embodiments, the turret 170 is rotatable and includes two supports 171a, 171b. The turret 170 is configured to make one of the supports 171a, 171b be adjacent to the passage 113 and make another of the supports 171a, 171b be adjacent to the chuck 180 and is configured to rotate to exchange the positions of the supports 171a, 171b. In some embodiments, the mask 200 may be transferred to one of the supports 171a, 171b adjacent to the passage 113 by the robot arm 130, and the mask 200 may be then transferred to the chuck 180 by rotating the turret 170. In some embodiments, the mask 200 secured at the chuck 180 may be removed by one of the support 171a, 171b adjacent to the chuck 180, and the mask 200 may be then moved to be adjacent to the passage 113 by rotating the turret 170 and picked up by the robot arm 130. In other words, the mask 200 secured at the chuck 180 can be exchanged with another mask 200 by rotating the turret 170 after said another mask 200 has been transferred to one of the supports 171a, 171b adjacent to the passage 113.

Figure 5:
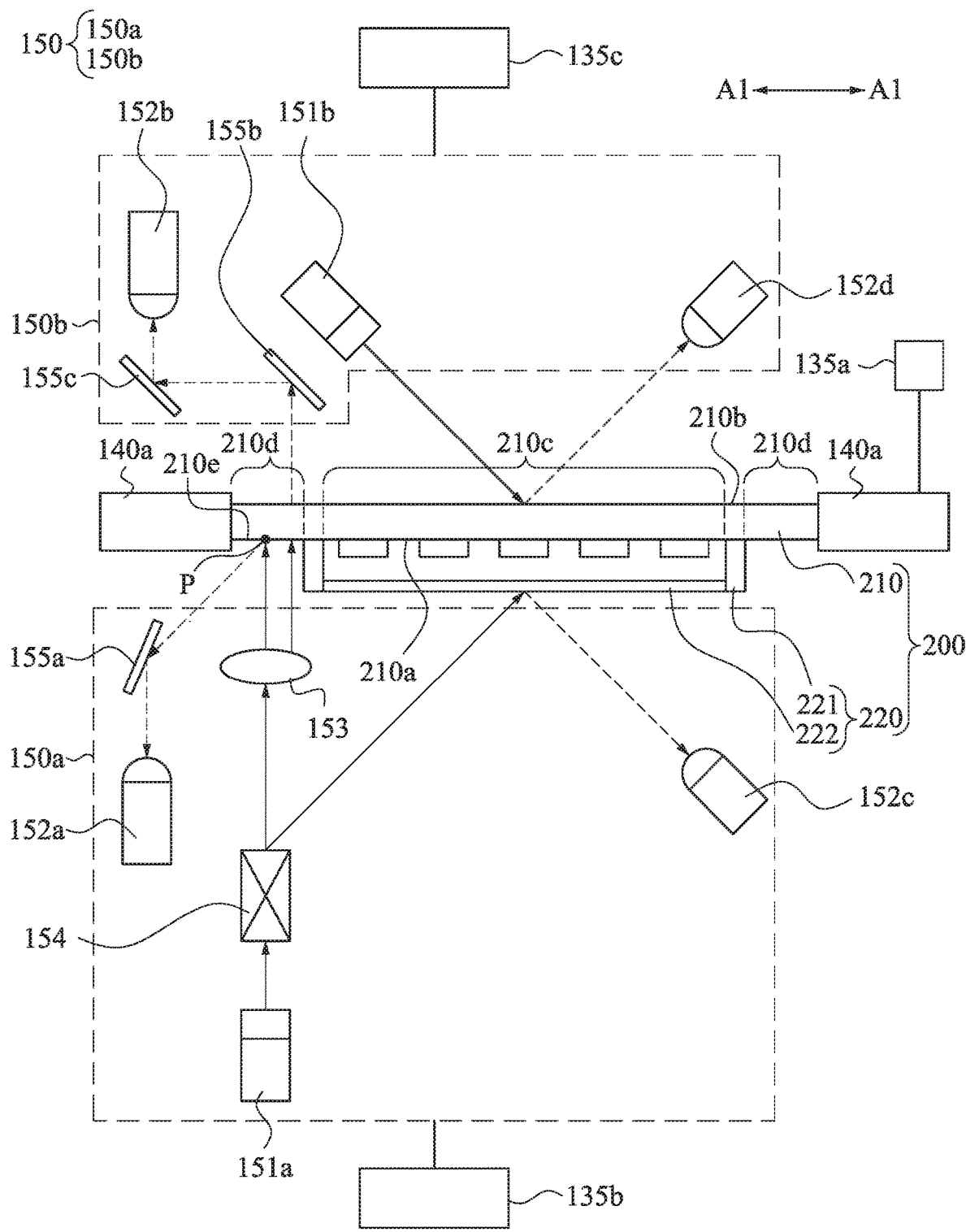
FIG. 5 is a schematic diagram illustrating a first optical inspection module and a mask held at a first place in the lithography apparatus in accordance with some embodiments of the instant disclosure.

Reference is made to FIG. 5. FIG. 5 is a schematic diagram illustrating a first optical inspection module 150 and the mask 200 held by the first holder 140a at the first place in the lithography apparatus 100 (FIG. 4) in accordance with some embodiments of the instant disclosure. In some embodiments, as shown in FIG. 5, the mask 200 includes a substrate 210 and a pellicle assembly 220. The substrate 210 has a first surface 210a and a second surface 210b opposite to each other. The pellicle assembly 220 includes a pellicle frame 221 and a transparent thin membrane 222. The pellicle frame 221 is mounted on the first surface 210a of the substrate 210. The transparent thin membrane 222 is mounted over the pellicle frame 221. The substrate 210 may be divided into a patterned area 210c and a non-patterned area 210d by the pellicle frame 221. For example, a portion of the substrate 210 within a range enclosed by the pellicle frame 221 may be regarded as the patterned area 210c, and a portion of the substrate 210 within a range out of the pellicle frame 221 may be regarded as the non-patterned area 210d. The pellicle assembly 220 protects the patterned area 210c from fallen particles and keeps the particles out of focus so that they do not produce a patterned image, which may cause defects when the mask 200 is being used in a lithography process. In some embodiments, the transparent thin membrane 222 is stretched and mounted over the pellicle frame 221 and is attached to the pellicle frame 221 by glue or other adhesives. The first holder 140a is configured to abut against opposite sidewalls of the substrate 210 of the mask 200, so as to secure the mask 200 at the first place. A contact surface 210e of the mask 200 contacts the chuck 180 when the mask 200 is disposed on the chuck 180, and the contact surface 210e of the mask 200 is a portion of the first surface 210a that is in the non-patterned area 210d. That is, the contact surface 210e of the mask 200 is a portion of the first surface 210a that is free from coverage by the pellicle assembly 220. In some embodiments, the mask 200 has a plurality of the non-patterned areas 210d, and the patterned area 210c is between the non-patterned areas 210d.

In some embodiments, as shown in FIG. 5, the lithography apparatus 100 (FIG. 4) further includes the first optical inspection module 150. The first optical inspection module 150 is configured to inspect the contact surface 210e of the mask 200 when the mask 200 is held by the first holder 140a. The first optical inspection module 150 is in the first compartment 111 (FIG. 4) and is configured to determine whether a particle P is present on the contact surface 210e of the mask 200. In some embodiments, the first optical inspection module 150 is a dark-field microscope or the like. Specifically, the first optical inspection module 150 includes a light source 151a and a detector 152a. The light source 151a is configured to emit light toward the contact surface 210e of the mask 200 when the mask 200 is held by the first holder 140a. The detector 152a is configured to detect light reflected by the contact surface 210e of the mask 200. As such, by analyzing the light reflected by the contact surface 210e of the mask 200, whether the particle P is present on the contact surface 210e of the mask 200 can be determined. Whether the substrate 210 of the mask 200 is a transmissive substrate or a reflective substrate, the detector 152a can be used to detect the particle P on the contact surface 210e of the mask 200.

In some embodiments, as shown in FIG. 5, the light source 151a and the detector 152a are at a side of the first holder 140a adjacent to the first surface 210a and away from the second surface 210b of the substrate 210 when the mask 200 is held by the first holder 140a.

In some embodiments, as shown in FIG. 5, the first optical inspection module 150 further includes another detector 152b. The detector 152b is configured to detect light passing through the mask 200. As such, by analyzing the light emitted toward the contact surface 210e of the mask 200 by the light source 151a and passing through the mask 200, whether the particle P is present on the contact surface 210e of the mask 200 can be determined. By comparing the results obtained by the detectors 152a, 152b, detection of the particle P can be more precise. In other words, if the substrate 210 of the mask 200 is a transmissive substrate, the detector 152b can be further used to increase accuracy of the detection of the particle P. In some embodiments, if the substrate 210 of the mask 200 is a reflective substrate, the detector 152b can be turned off. In some embodiments, since the detector 152a can detect the particle P regardless of whether the substrate 210 of the mask 200 is a transmissive substrate or a reflective substrate, the detector 152b can be omitted. In some embodiments, the substrate 210 of the mask 200 may include glass, quartz, silicon, silicon carbide, black diamond, combinations thereof, or the like. In some embodiments, as shown in FIG. 5, the detector 152b is at a side of the first holder 140a adjacent to the second surface 210b and away from the first surface 210a of the substrate 210 when the mask 200 is held by the first holder 140a.

In some embodiments, as shown in FIG. 5, the first optical inspection module 150 further includes an objective lens 153. The objective lens 153 is configured to focus the light emitted by the light source 151a onto the contact surface 210e of the mask 200.

In some embodiments, as shown in FIG. 5, the first optical inspection module 150 further includes a beam splitter 154 and another detector 152c. The beam splitter 154 is between the light source 151a and the objective lens 153 and is configured to split the light emitted by the light source 151a into a light beam oriented toward the contact surface 210e of the mask 200 through the objective lens 153 and a light beam oriented toward the patterned area 210c. The detector 152c is configured to detect light reflected by the transparent thin membrane 222 of the mask 200. In some embodiments, the light emitted by the light source 151a is laser light with a single wavelength, and the beam splitter 154 is a polarizing beam splitter (PBS) configured to split the laser light into two laser beams of different polarizations. As such, by analyzing the light reflected by the transparent thin membrane 222 of the mask 200, contamination (e.g., particles, dirt, or the like) on the transparent thin membrane 222 of the pellicle assembly 220 can be detected. In some embodiments, as shown in FIG. 5, the beam splitter 154 and the detector 152c are at a side of the first holder 140a adjacent to the first surface 210a and away from the second surface 210b of the substrate 210 when the mask 200 is held by the first holder 140a.

In some embodiments, as shown in FIG. 5, the first optical inspection module 150 further includes another light source 151b and another detector 152d. The light source 151b is configured to emit light toward the patterned area 210c when the mask 200 is held by the first holder 140a. The detector 152d is configured to detect light reflected by the patterned area 210c of the substrate 210 (i.e., reflected by the second surface 210b). With the optical configurations, the light beam emitted from the light source 151b is reflected by the second surface 210b. The light beam reflected by the second surface 210b is then received by the detector 152d. As such, by analyzing the light reflected by the second surface 210b in the patterned area 210c, contamination (e.g., particles, dirt, or the like) on the second surface 210b in the patterned area 210c can be detected. In some embodiments, as shown in FIG. 5, the light source 151b and the detector 152d are at a side of the first holder 140a adjacent to the second surface 210b and away from the first surface 210a of the substrate 210 when the mask 200 is held by the first holder 140a, and the light sources 151a, 151b are respectively at opposite sides of the first holder 140a.

In some embodiments, as shown in FIG. 5, the first optical inspection module 150 further includes a reflector 155a. The reflector 155a is configured to redirect the light reflected by the contact surface 210e of the mask 200 to the detector 152a. In some embodiments, as shown in FIG. 5, the first optical inspection module 150 further includes two reflectors 155b, 155c. The reflector 155b is configured to redirect the light passing through the mask 200 to the reflector 155c. The reflector 155c is configured to redirect the light reflected by the reflector 155b to the detector 152b.

With the optical configurations, the light beam emitted from the light source 151a is splitted into a first light beam and a second light beam by the beam splitter 154. The first light beam propagates toward the objective lens 153. The first light beam propagating toward the objective lens 153 is condensed by the objective lens 153 and propagates to the contact surface 210e. A first part of the condensed first light beam is reflected by the contact surface 210e and propagates to the reflector 155a. The first part of the first light beam propagating to the reflector 155a is reflected by the reflector 155a, propagates to the detector 152a, and then is received by the detector 152a. A second part of the condensed first light beam propagates through the substrate 210 toward the reflector 155b. The second part of the first light beam propagating to the reflector 155b is reflected by the reflector 155b and propagates to the reflector 155c. The second part of the first light beam propagating to the reflector 155c is reflected by the reflector 155c, propagates to the detector 152b, and then is received by the detector 152b. The second light beam from the beam splitter 154 is reflected by the transparent thin membrane 222. The second light beam reflected by the transparent thin membrane 222 is then received by the detector 152c. As such, by using the reflectors 155a, 155b, 155c, the physical dimensions of the first optical inspection module 150 can be flexibly adjusted.

In some embodiments, as shown in FIG. 5, the light source 151a, the detectors 152a, 152c, the objective lens 153, the beam splitter 154, and the reflector 155a are at the side of the first holder 140a adjacent to the first surface 210a and away from the second surface 210b when the mask 200 is held by the first holder 140a and may be grouped as a first optical combination 150a of the first optical inspection module 150. The light source 151b, the detectors 152b, 152d, and the reflectors 155b, 155c are at the side of the first holder 140a adjacent to the second surface 210b and away from the first surface 210a of the substrate 210 when the mask 200 is held by the first holder 140a and may be grouped as a second optical combination 150b of the first optical inspection module 150.

In some embodiments, the first holder 140a and the first optical inspection module 150 may move relative to each other. In some embodiments, as shown in FIG. 5, the lithography apparatus 100 includes a moving module 135a. The moving module 135a is configured to move the first holder 140a in a direction A1 substantially parallel to the substrate 210 of the mask 200 when the mask 200 is held by the first holder 140a. In some embodiments, as shown in FIG. 5, the lithography apparatus 100 further includes moving modules 135b, 135c. The moving module 135b is configured to move the first optical combination 150a in the direction A1 when the mask 200 is held by the first holder 140a, and the moving module 135c is configured to synchronously move the second optical combination 150b in the direction A1. In other words, the direction A1 may be substantially perpendicular to a sidewall of the first holder 140a that is configured to abut against the sidewall of the substrate 210 of the mask 200. In some embodiments, at least one of the moving modules 135a, 135b, 135c may be a linear actuator that creates a linear motion to move one of the first holder 140a, the first optical combination 150a, and the second optical combination 150b in a straight line along the direction A1. In some other embodiments, at least one of the moving modules 135a, 135b, 135c may be a two-dimensional moving module that creates a motion to move one of the first holder 140a, the first optical combination 150a, and the second optical combination 150b in a plane substantially parallel to the substrate 210 when the mask 200 is held by the first holder 140a. In some other embodiments, at least one of the moving modules 135a, 135b, 135c may be a three-dimensional moving module that creates a three-dimensional motion to move one of the first holder 140a, the first optical combination 150a, and the second optical combination 150b. In some embodiments, the moving module 135a may be omitted. In some embodiments, the moving modules 135b, 135c may be omitted. In some embodiment, the moving module 135b is configured to move one or more components in the first optical combination 150a in the direction A1. In some embodiment, the moving module 135c is configured to move one or more components in the second optical combination 150b in the direction A1.

Figure 6:
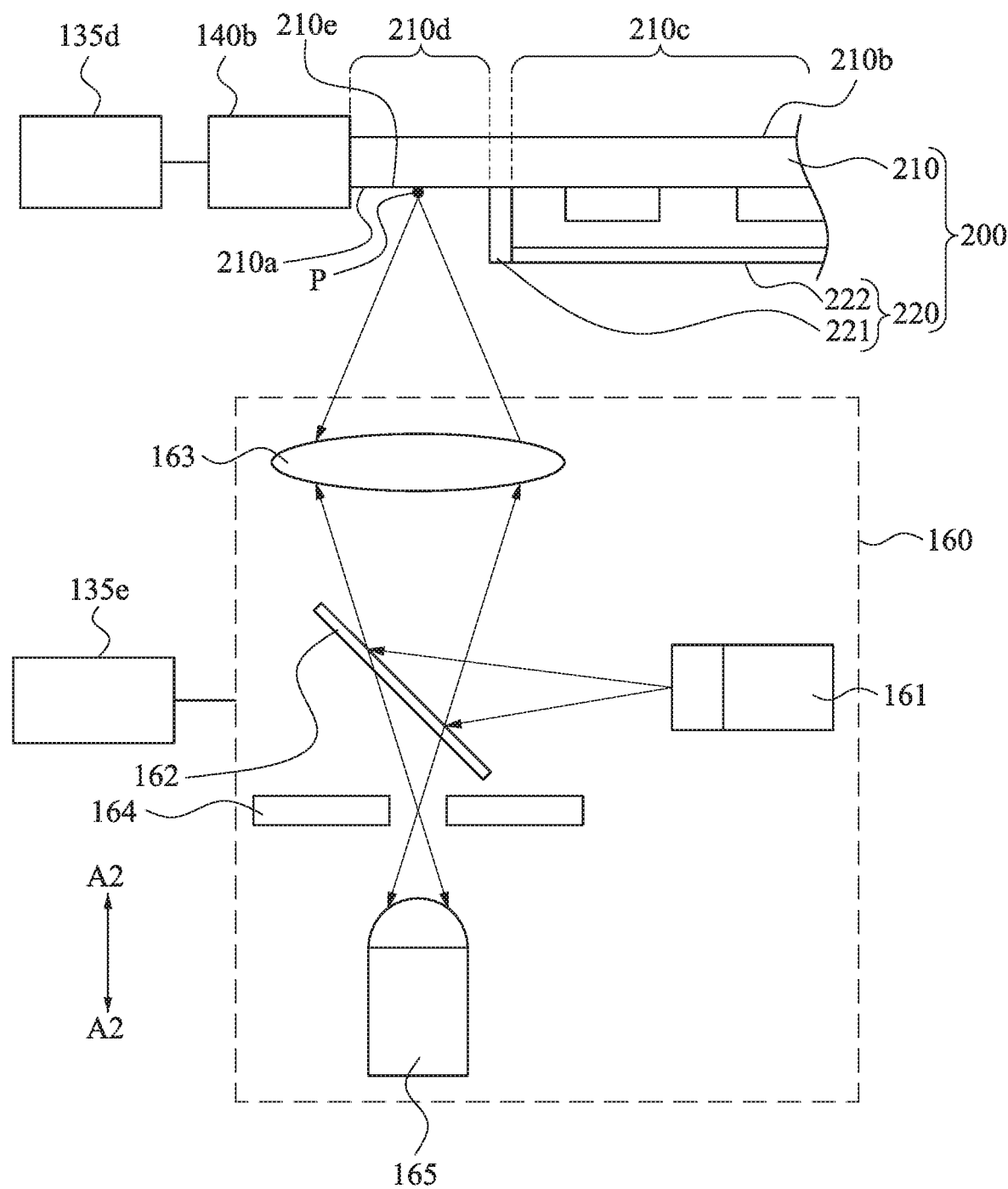
FIG. 6 is a schematic diagram illustrating a second optical inspection module and the mask held at a second place in the lithography apparatus in accordance with some embodiments of the instant disclosure.

Reference is made to FIG. 6. FIG. 6 is a schematic diagram illustrating a second optical inspection module 160 and the mask 200 held by the second holder 140b at the second place in the lithography apparatus 100 in accordance with some embodiments of the instant disclosure. The second optical inspection module 160 is at a side of the second holder 140b adjacent to the first surface 210a and away from the second surface 210b of the substrate 210 when the mask 200 is held by the second holder 140b and is configured to determine a height of the particle P. The second optical inspection module 160 is in the first compartment 111 and is configured to determine the height of the particle P if the particle P is present on the contact surface 210e of the mask 200. In some embodiments, the second optical inspection module 160 is a confocal microscope using, for example, confocal laser scanning microscopy. Specifically, the second optical inspection module 160 includes a light source 161, a dichroic mirror 162, an objective lens 163, a confocal aperture 164, and a detector 165. The dichroic mirror 162 is configured to reflect a part of light emitted by the light source 161 toward the contact surface 210e of the mask 200. The objective lens 163 is configured to focus light reflected by the dichroic mirror 162 onto the contact surface 210e of the mask 200. The dichroic mirror 162 is between the objective lens 163 and the confocal aperture 164, and the confocal aperture 164 is between the dichroic mirror 162 and the detector 165. In other words, the objective lens 163, the dichroic mirror 162, the confocal aperture 164, and the detector 165 are sequentially arranged in a line. The detector 165 is configured to obtain images sequentially via the confocal aperture 164, the dichroic mirror 162, and the objective lens 163. In some embodiments, the detector 165 is a photomultiplier tube (PMT) or the like.

With the foregoing optical configurations, the light beam emitted from the light source 161 is at least partially reflected by the dichroic mirror 162 and then propagates toward the objective lens 163. The reflected light beam is condensed by the objective lens 163 and propagates to the contact surface 210e. The condensed light beam is reflected by the contact surface 210e, propagates through the dichroic mirror 162 and confocal aperture 164, and is received by the detector 165. In some embodiments, the light beam that is reflected by the dichroic mirror 162 and propagates toward the objective lens 163 has a first wavelength (e.g., a wavelength within a range from about 450 nm to about 495 nm), and the light beam reflected by the contact surface 210e has a second wavelength (e.g., a wavelength within a range from about 495 nm to about 570 nm) and is allowed to propagate through the dichroic mirror 162. In some embodiments, the light beam emitted from the light source 161 is a white light beam (e.g., having wavelengths from about 380 nm to about 780 nm). In some embodiments, the light beam emitted from the light source 161 is a laser beam with a single wavelength, and the wavelength is chosen such that the light beam will be reflected by the dichroic mirror 162.

In some embodiments, the second holder 140b and the second optical inspection module 160 may move relative to each other. In some embodiments, as shown in FIG. 6, the lithography apparatus 100 includes a moving module 135d. The moving module 135d is configured to move the second holder 140b in a direction A2 substantially perpendicular to the substrate 210 of the mask 200 when the mask 200 is held by the second holder 140b. In some embodiments as shown in FIG. 6, the lithography apparatus 100 further includes a moving module 135e. The moving module 135e is configured to move the second optical inspection module 160 in the direction A2. In other words, the direction A2 may be parallel to a sidewall of the second holder 140b that is configured to abut against the sidewall of the substrate 210 of the mask 200. In some embodiments, at least one of the moving modules 135d, 135e may be a linear actuator that creates a linear motion to move one of the second holder 140b and the second optical inspection module 160 in a straight line along the direction A2, but the disclosure is not limited in this regard. In some other embodiments, at least one of the moving module 135d, 135e may be a two-dimensional moving module that creates a motion to move one of the second holder 140b and the second optical inspection module 160 in a plane perpendicular to the substrate 210 when the mask 200 is held by the second holder 140b. In some other embodiments, at least one of the moving module 135d, 135e may be a three-dimensional moving module that creates a three-dimensional motion to move one of the second holder 140b and the second optical inspection module 160. In some embodiments, one of the moving modules 135d, 135e may be omitted. In some embodiment, the moving module 135e is configured to move one or more components in the second optical inspection module 160 (e.g., the objective lens 163) in the direction A2.

Figure 7:
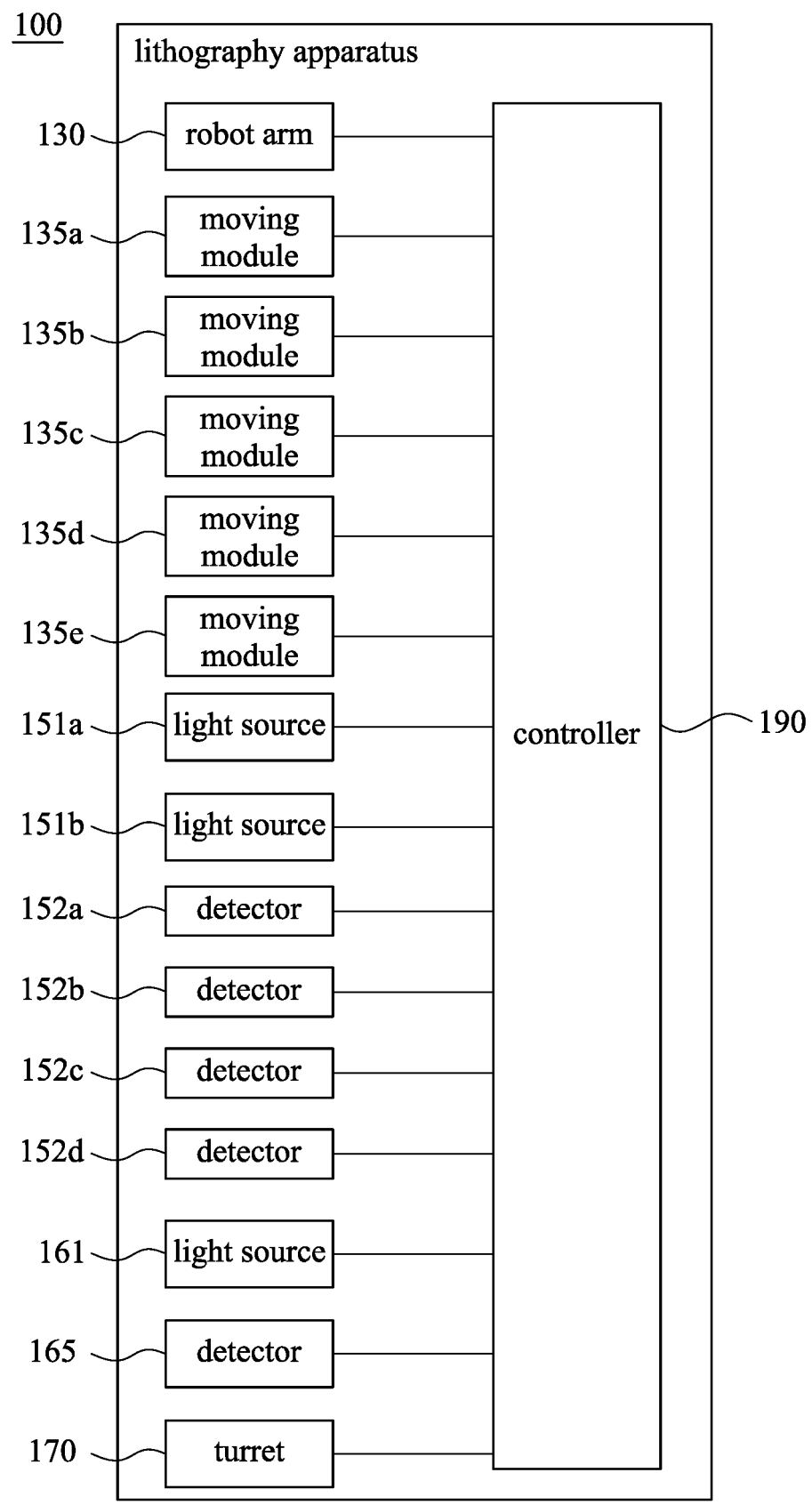
FIG. 7 is a function block diagram illustrating the lithography apparatus in accordance with some embodiments of the instant disclosure.

Reference is made to FIGS. 4, 5, and 7. FIG. 7 is a function block diagram illustrating the lithography apparatus 100 in accordance with some embodiments of the instant disclosure. The lithography apparatus 100 further includes a controller 190. The controller 190 is electrically connected to the robot arm 130. In some embodiments, when the mask 200 is loaded from one of the two load ports 120a, 120b, the controller 190 controls the robot arm 130 to transfer the mask 200 to the first place to be held by the first holder 140a. The first optical inspection module 150 then inspects the contact surface 210e of the mask 200. The controller 190 is further configured to determine whether a particle is present on the contact surface 210e of the mask 200 by analysing the image received from the first optical inspection module 150. Specifically, the controller 190 may control the moving modules 135a, 135b, 135c to respectively move the first holder 140a, the first optical combination 150a, and the second optical combination 150b, so as to entirely or partially scan, for example, the contact surface 210e, the first surface 210a in the non-patterned area 210d, the transparent thin membrane 222, and/or the second surface 210b by the first optical inspection module 150.

In some embodiments, the controller 190 is further configured to control the light source 151a to emit light toward the contact surface 210e of the mask 200 when the mask 200 is held by the first holder 140a. The controller 190 is configured to receive an image from the detector 152a and is configured to determine presence and a location of the particle P on the contact surface 210e of the mask 200 by analysing the image received from the detector 152a. In some embodiments, the controller 190 is further configured to receive an image from the detector 152b and is configured to determine the presence and the location of the particle P on the contact surface 210e of the mask 200 by analysing the image received from the detector 152b. If a particle P is present on the contact surface 210e of the mask 200, the controller 190 is further configured to control the robot arm 130 to move the mask 200 from the first place to the second place to be held by the second holder 140b. The detection result may also include the location of the particle P on the contact surface 210e of the mask 200.

In some embodiments, the controller 190 is further configured to determine whether contamination (e.g., particles, dirt, or the like) is present on the transparent thin membrane 222 of the pellicle assembly 220. In some embodiments, the controller 190 is configured to control the light source 151a to emit light toward the transparent thin membrane 222 when the mask 200 is held by the first holder 140a. The controller 190 is configured to receive an image from the detector 152c and is configured to determine presence and a location of the contamination on the transparent thin membrane 222 by analysing the image received from the detector 152c.

In some embodiments, the controller 190 is further configured to determine whether contamination (e.g., particles, dirt, or the like) is present on the second surface 210b of the substrate 210. In some embodiments, the controller 190 is configured to control the light source 151b to emit light toward the second surface 210b of the substrate 210 when the mask 200 is held by the first holder 140a. The controller 190 is configured to receive an image from the detector 152d and is configured to determine presence and a location of the contamination on the second surface 210b of the substrate 210 by analysing the image received from the detector 152d.

Reference is made to FIGS. 4, 6, and 7. In some embodiments, the second optical inspection module 160 then determines a height of the particle P at the second place. Specifically, the controller 190 may control the moving module 135e to move the second optical inspection module 160 to capture a plurality of images of the particle P at different heights. The controller 190 is configured to control the light source 161 to emit light and is configured to receive the images of the particle P from the detector 165. The images are two-dimensional images. The focal plane of the light reflected by the dichroic mirror 162 is parallel to the contact surface 210e of the mask 200. The height of the particle P may be determined according to presence of the particle P in the images. For example, if the particle P is present in an image and is absent in a next image, a height of the focal plane corresponding to the former image relative to the contact surface 210e of the mask 200 may be regarded as the height of the particle P.

In some embodiments, the controller 190 is configured to control the robot arm 130 to move the mask 200 from the second place to one of the load ports 120a, 120b to unload the mask 200 when the height of the particle P is determined to be greater than a predetermined height. In some embodiments, the mask 200 may be then cleaned to remove the particle P from the contact surface 210e of the mask 200. In some embodiments, the mask 200 may be cleaned by a tool outside the lithography apparatus 100. In some embodiments, whether the particle P is present on the contact surface of the mask 200 is determined again after the mask 200 is cleaned.

In some embodiments, the controller 190 is configured to control the robot arm 130 to move the mask 200 from the first place to one of the load ports 120a, 120b to unload the mask 200 when the particle P is determined to be present on the contact surface 210e of the mask 200. The mask 200 is cleaned to remove the particle P from the contact surface 210e of the mask 200 whether the height of the particle P is greater than the predetermined height or not.

In some embodiments, the controller 190 is configured to control the robot arm 130 to move the mask 200 from the second place to the chuck 180 with the assistance of the turret 170 when the height of the particle P is determined to be less than the predetermined height. In some embodiments, the mask 200 is moved to the chuck 180 when the height of the particle P is determined to be less than about 40 μm. If the particle P having a height greater than about 40 μm is present on the contact surface 210e of the mask 200, the mask 200 might have a significant deformation when the contact surface 210e of the mask 200 is in contact with the chuck 180. In some embodiments, the controller 190 is configured to control the robot arm 130 to move the mask 200 from the first place to the chuck 180 with the assistance of the turret 170 when no particle P is detected.

As shown in FIG. 4, the robot arm 130 may first move the mask 200 to the turret 170 through the passage 113, and the turret 170 may then rotate to transfer the mask 200 to the chuck 180. Afterward, the mask 200 is secured by the chuck 180, and a lithography process is performed using the secured mask 200. In some embodiments, after performing the lithography process, the mask 200 may be transferred to one of the load ports 120a, 120b to be unloaded sequentially by the turret 170 and the robot arm 130. The chuck 180 secures the mask 200 by suction. In some embodiments, the controller 190 may include a plurality of processing units arranged in the lithography apparatus 100, and the foregoing functions of the controller 190 may be assigned to be performed by these processing units.

Figure 8:
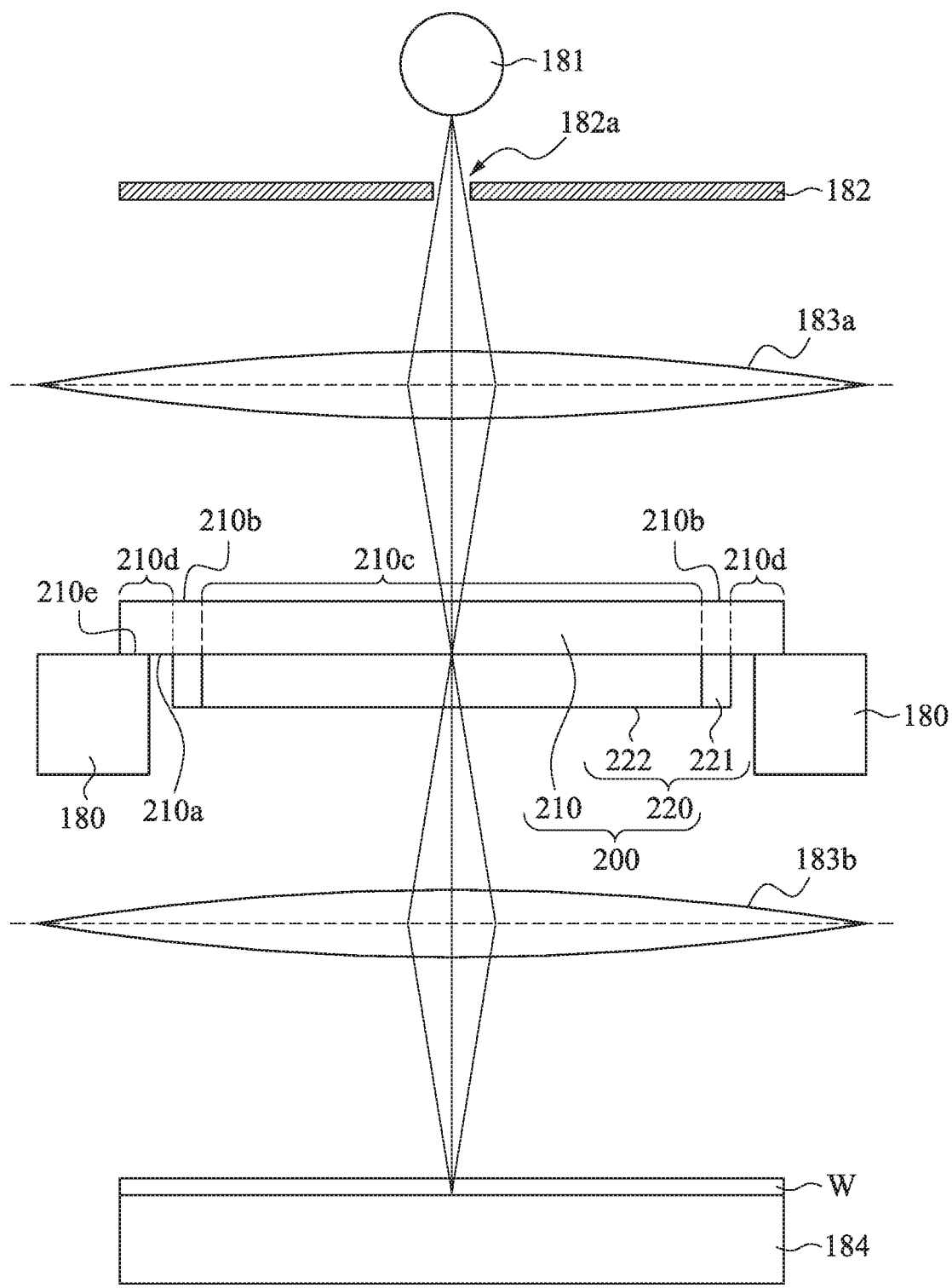
FIG. 8 is a schematic diagram illustrating a partial cross-sectional view of the lithography apparatus in accordance with some embodiments of the instant disclosure.

Reference is made to FIG. 8. FIG. 8 is a schematic diagram illustrating a partial cross-sectional view of the lithography apparatus 100 in accordance with some embodiments of the instant disclosure. The apparatus 100 further includes a light source 181, a baffle 182, lenses 183a, 183b, and a wafer stage 184. The chuck 180 is configured to secure the substrate 210 of the mask 200. The contact surface 210e of the mask 200 is in contact with the chuck 180. The light source 181 is over the chuck 180. The baffle 182 is between the chuck 180 and the light source 181, and has an exposure slit 182a. The light source 181 is configured to emit light toward the mask 200 through the exposure slit 182a. The lens 183a is between the baffle 182 and the chuck 180 and configured to focus the light emitted by the light source 181 onto the substrate 210. The wafer stage 184 is under the chuck 180 and configured to support a wafer W thereon. The lens 183b is between the wafer stage 184 and the chuck 180 and configured to focus the light passing through the substrate 210 onto the wafer W. With the optical configurations, the light emitted from the light source 181 propagates to the lens 183a through the exposure slit 182a of the baffle 182. The light propagating to the lens 183a is condensed by the lens 183a and propagate to the lens 183b through the substrate 210 of the mask 200. The light propagating to the lens 183b is condensed by the lens 183b and propagates to the wafer W. The lithography apparatus 100 is configured to perform a lithography process of transferring patterns of geometric shapes on the substrate 210 to a thin layer of photosensitive material (called photoresist) covering the surface of the wafer W. The exposure method used by the lithography apparatus 100 is projection printing or the like. In some embodiments, the lithography apparatus 100 uses a type of stepper called a scanner, which moves the wafer stage 184 and chuck 180 with respect to each other during the exposure, as a way of increasing the size of the exposed area and increasing the imaging performance of the lenses 183a, 183b.

By monitoring and controlling the surface condition of the contact surface 210e of the mask 200, the mask 200 would not have a significant deformation when the contact surface 210e of the mask 200 is in contact with the chuck 180. Hence, the overlay control is enhanced.

In some embodiments, a method includes determining whether a particle is present on a contact surface of a mask. The mask is cleaned to remove the particle from the contact surface of the mask if the particle is present on the contact surface. The mask is disposed on a chuck after cleaning the mask, wherein the contact surface of the mask contacts the chuck when the mask is disposed on the chuck. A lithography process is performed using the mask disposed on the chuck.

In some embodiments, a method includes determining whether a particle is present on a contact surface of a mask. A height of the particle is determined if the particle is present on the contact surface. Whether the height of the particle is less than a predetermined height is determined. The mask is disposed on a chuck if the height of the particle is less than the predetermined height, wherein the contact surface of the mask contacts the chuck when the mask is disposed on the chuck. A lithography process is performed using the mask disposed on the chuck.

In some embodiments, a lithography apparatus includes a first compartment, an inspection system, a measurement system, a second compartment, a chuck, and a transferring mechanism. The inspection system is in the first compartment and configured to determine whether a particle is present on a mask. The measurement system is in the first compartment and configured to determine a height of the particle if the particle is present on the mask. The first compartment and the second compartment share a sidewall, and the sidewall has a passage communicating the first compartment and the second compartment. The chuck is in the second compartment. The transferring mechanism is configured to transfer the mask among the chuck, the inspection system, and the measurement system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    emitting light toward a contact surface of a mask such that at least a first portion of the light passes through the mask;

detecting at least the first portion of the light that passes through the mask;

determining whether a particle is present on the contact surface of the mask based on at least the detected first portion of the light;

cleaning the mask to remove the particle from the contact surface of the mask when the particle is present on the contact surface;

disposing the mask on a chuck after cleaning the mask, wherein the contact surface of the mask contacts the chuck when the mask is disposed on the chuck; and performing a lithography process using the mask disposed on the chuck.

2. The method of claim 1, further comprising:

determining again whether the particle is present on the contact surface of the mask, after cleaning the mask.

3. The method of claim 1, wherein determining whether the particle is present on the contact surface of the mask and disposing the mask on the chuck are performed in the same tool.

4. The method of claim 1, wherein determining whether the particle is present on the contact surface of the mask is performed using dark-field inspection.

5. The method of claim 1, wherein the mask has a patterned area and a non-patterned area, and the contact surface of the mask is in the non-patterned area.

6. The method of claim 1, wherein the mask has a plurality of non-patterned areas and a patterned area between the non-patterned areas, and the contact surface of the mask is in the non-patterned areas.

7. The method of claim 1, wherein determining whether the particle is present on the contact surface of the mask and cleaning the mask are performed in different tools.

8. A method, comprising:

determining whether a particle is present on a contact surface of a mask;

emitting light toward a dichroic mirror such that the light is reflected by the dichroic mirror to the contact surface of the mask;

receiving the light to capture images of the particle;

determining a height of the particle based on presence of the particle in the images when the particle is present on the contact surface;

determining whether the height of the particle is less than a predetermined height;

disposing the mask on a chuck when the height of the particle is less than the predetermined height, wherein the contact surface of the mask contacts the chuck when the mask is disposed on the chuck; and performing a lithography process using the mask disposed on the chuck.

9. The method of claim 8, further comprising:

cleaning the mask when the height of the particle is greater than the predetermined height.

10. The method of claim 8, wherein determining the height of the particle comprises:

capturing a plurality of two-dimensional images of the particle at different heights; and determining the height of the particle using the two-dimensional images of the particle.

11. The method of claim 8, wherein determining whether the particle is present on the contact surface of the mask and determining the height of the particle are performed in the same tool.

12. The method of claim 8, further comprising:

holding the mask using a holder contacting opposite sidewalls of the mask when determining whether the particle is present on the contact surface of the mask.

13. The method of claim 8, further comprising:

holding the mask using a holder contacting opposite sidewalls of the mask when determining the height of the particle.

14. A method, comprising:

moving a mask in a housing through a robot arm;

placing the mask, through the robot arm, on a first holder;

determining whether a particle is present on a contact surface of the mask when the mask is on the first holder;

placing the mask, through the robot arm, on a second holder adjacent to the first holder;

determining a height of the particle when the particle is determined present on the contact surface and when the mask is on the second holder; and disposing the mask through the robot arm, on a chuck when no particle is detected on the contact surface or when the height of the particle is less than a predetermined height, wherein the contact surface of the mask contacts the chuck when the mask is disposed on the chuck.

15. The method of claim 14, wherein determining whether a particle is present on the contact surface of the mask comprises:

emitting a light toward the contact surface of the mask; and detecting the light reflected from the contact surface of the mask.

16. The method of claim 14, wherein determining whether a particle is present on the contact surface of the mask comprises:

emitting a light toward the contact surface of the mask; and detecting the light passing through the contact surface of the mask.

17. The method of claim 14, wherein determining a height of the particle comprises:

capturing a plurality of two-dimensional images of the particle at different heights; and determining the height of the particle using the two-dimensional images of the particle.

18. The method of claim 14, further comprising determining whether a particle is present on a pellicle assembly of the mask when the mask is placed on the first holder.

19. The method of claim 1, wherein emitting the light toward the contact surface of the mask is performed such that at least a second portion of light is reflected by the mask;

the method further comprising: detecting at least the second portion of light that is reflected by the mask, wherein whether the particle is present on the contact surface of the mask is determined based on at least the detected first and second portions of the light.

20. The method of claim 8, wherein emitting the light toward the dichroic mirror is performed such that the light is reflected by at least the contact surface of the mask to a detector through the dichroic mirror, and wherein receiving the light is performed using the detector.

* * * * *